United States Patent
Orii et al.

(10) Patent No.: US 11,189,498 B2
(45) Date of Patent: Nov. 30, 2021

(54) METHOD OF ETCHING SILICON-CONTAINING FILM, COMPUTER-READABLE STORAGE MEDIUM, AND APPARATUS FOR ETCHING SILICON-CONTAINING FILM

(71) Applicant: TOKYO ELECTRON LIMITED, Tokyo (JP)

(72) Inventors: Takehiko Orii, Nirasaki (JP); Yasuo Asada, Nirasaki (JP); Jun Lin, Nirasaki (JP); Ayano Hagiwara, Nirasaki (JP); Shinji Irie, Nirasaki (JP); Kenji Tanouchi, Nirasaki (JP); Kakeru Wada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/413,068

(22) Filed: May 15, 2019

(65) Prior Publication Data
US 2019/0355589 A1    Nov. 21, 2019

(30) Foreign Application Priority Data
May 16, 2018 (JP) .............................. JP2018-094597

(51) Int. Cl.
*H01L 21/3213* (2006.01)
*H01L 21/67* (2006.01)

(52) U.S. Cl.
CPC .. *H01L 21/32135* (2013.01); *H01L 21/67069* (2013.01)

(58) Field of Classification Search
CPC ......... H01L 21/32135; H01L 21/67069; H01L 21/67109; H01L 21/67248; H01L 21/30604; H01L 21/31116; H01L 21/3065; H01L 21/02123
See application file for complete search history.

(56) References Cited

U.S. PATENT DOCUMENTS

| | | | |
|---|---|---|---|
| 2013/0295712 A1* | 11/2013 | Chen ................ | H01L 31/02363 438/71 |
| 2017/0207067 A1* | 7/2017 | Kaelberer ......... | H01J 37/32449 |
| 2017/0271165 A1* | 9/2017 | Kal ................... | H01L 21/32135 |
| 2019/0131135 A1* | 5/2019 | Belau ............... | H01L 21/31116 |
| 2019/0206884 A1* | 7/2019 | Ng .................... | H01L 29/40117 |

FOREIGN PATENT DOCUMENTS

| JP | 8-153711 A | 6/1996 |
|---|---|---|
| JP | 2016-143781 A | 8/2016 |
| KR | 10-2014-0053333 A | 5/2014 |

\* cited by examiner

*Primary Examiner* — Nadine G Norton
*Assistant Examiner* — Mahmoud Dahimene
(74) *Attorney, Agent, or Firm* — Nath, Goldberg & Meyer; Jerald L. Meyer; Tanya E. Harkins

(57) ABSTRACT

There is provided a method of etching a silicon-containing film formed on a substrate, the method including: etching the silicon-containing film by using both a first fluorine-containing gas and a second fluorine-containing gas, the first fluorine-containing gas including at least an $F_2$ gas and the second fluorine-containing gas including at least a $ClF_3$ gas, an $IF_7$ gas, an $IF_5$ gas or an $SF_6$ gas.

5 Claims, 8 Drawing Sheets

METHOD OF ETCHING SILICON-CONTAINING FILM, COMPUTER-READABLE STORAGE MEDIUM, AND APPARATUS FOR ETCHING SILICON-CONTAINING FILM

CROSS-REFERENCE TO RELATED APPLICATION

This application is based upon and claims the benefit of priority from Japanese Patent Application No. 2018-094597, filed on May 16, 2018, the entire contents of which are incorporated herein by reference.

TECHNICAL FIELD

The present disclosure relates to a method of etching a silicon-containing film formed on a substrate, a computer-readable recording medium, and an apparatus for etching the silicon-containing film.

BACKGROUND

In the field of semiconductor device, a silicon-containing film is applied to a wide variety of applications. For example, a silicon (Si) film is used for a gate electrode, a seed layer and the like. In a process of manufacturing semiconductor devices, the Si film formed on a substrate is etched.

Various techniques have been used to etch a silicon-containing film such as a Si film or the like. For example, there is known a technique that etches a Si layer with a halogen fluoride gas such as $ClF_3$. In addition, there is known a technique that etches Si with an etching gas system including an $F_2$ gas and an $NH_3$ gas.

It is sometimes required that a surface roughness of a silicon-containing film after etching is small. However, the above conventional etching techniques do not take into consideration the surface roughness.

Further, there is a case where a pattern is formed on a substrate by an oxide film or the like before etching a silicon-containing film formed on a substrate and a hole is formed in the pattern to expose an etching target portion of the silicon-containing film. In this case, there is a need of planarizing a front surface of the etched silicon-containing film in the hole. However, the conventional etching techniques do not take into consideration the planarization of the silicon-containing film in the hole of the pattern.

Therefore, there is room for improvement in the conventional silicon-containing film etching technique.

SUMMARY

Some embodiments of the present disclosure provide a technique capable of reducing a surface roughness of a silicon-containing film when etching the silicon-containing film formed on a substrate, and a technique capable of planarizing a surface of a silicon-containing film when etching the silicon-containing film formed on a substrate having a pattern in which a hole is formed so as to expose an etching target portion in the hole.

According to one embodiment of the present disclosure, there is provided a method of etching a silicon-containing film formed on a substrate, the method including: etching the silicon-containing film by using both a first fluorine-containing gas and a second fluorine-containing gas, the first fluorine-containing gas including at least an $F_2$ gas and the second fluorine-containing gas including at least a $ClF_3$ gas, an $IF_7$ gas, an $IF_5$ gas or an $SF_6$ gas.

According to another embodiment of the present disclosure, there is provided a non-transitory computer-readable storage medium storing a program that operates on a computer of a controller for controlling an etching apparatus and that causes the computer to perform the aforementioned etching method by the etching apparatus.

According to another embodiment of the present disclosure, there is provided an apparatus for etching a silicon-containing film formed on a substrate, including: a chamber in which the substrate is accommodated; and a gas supply part configured to supply both a first fluorine-containing gas and a second fluorine-containing gas onto the silicon-containing film, the first fluorine-containing gas including at least an $F_2$ gas, and the second fluorine-containing gas including at least a $ClF_3$ gas, an $IF_7$ gas, an $IF_5$ gas or an $SF_6$ gas.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
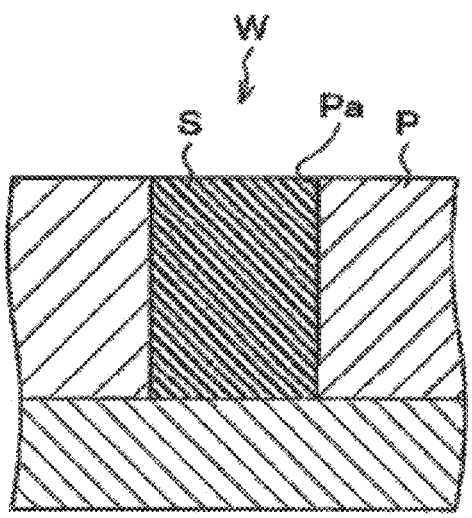
FIG. 1 is a schematic sectional view of a silicon-containing film to be etched by an etching apparatus according to an embodiment.

Hereinafter, embodiments of the present disclosure will be described with reference to the drawings. In the subject specification and the drawings, components having substantially identical functions and configurations will be designated by like reference numerals with the duplicate descriptions thereof omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

As a result of the earnest research conducted by the present inventors, it was found that, by etching a silicon-containing film with both a first fluorine-containing gas and a second fluorine-containing gas onto the silicon-containing film, the first fluorine-containing gas being inclusive of at least an $F_2$ gas, and the second fluorine-containing gas being inclusive of at least a $ClF_3$ gas, an $IF_7$ gas, an $IF_5$ gas or an $SF_6$ gas, it is possible to reduce a surface roughness of the etched silicon-containing film. In addition, as a result of the earnest research conducted by the present inventors, it was found that, by etching a silicon-containing film formed in a hole with both the first fluorine-containing gas and the second fluorine-containing gas, it is possible to planarize a surface of the etched silicon-containing film in the hole. A method of reducing the surface roughness of the etched silicon-containing film and planarizing the surface of the etched silicon-containing film in the hole by using both the first fluorine-containing gas and the second fluorine-containing gas, will be described in detail in the following embodiments.

<Etching Apparatus>

Figure 2:
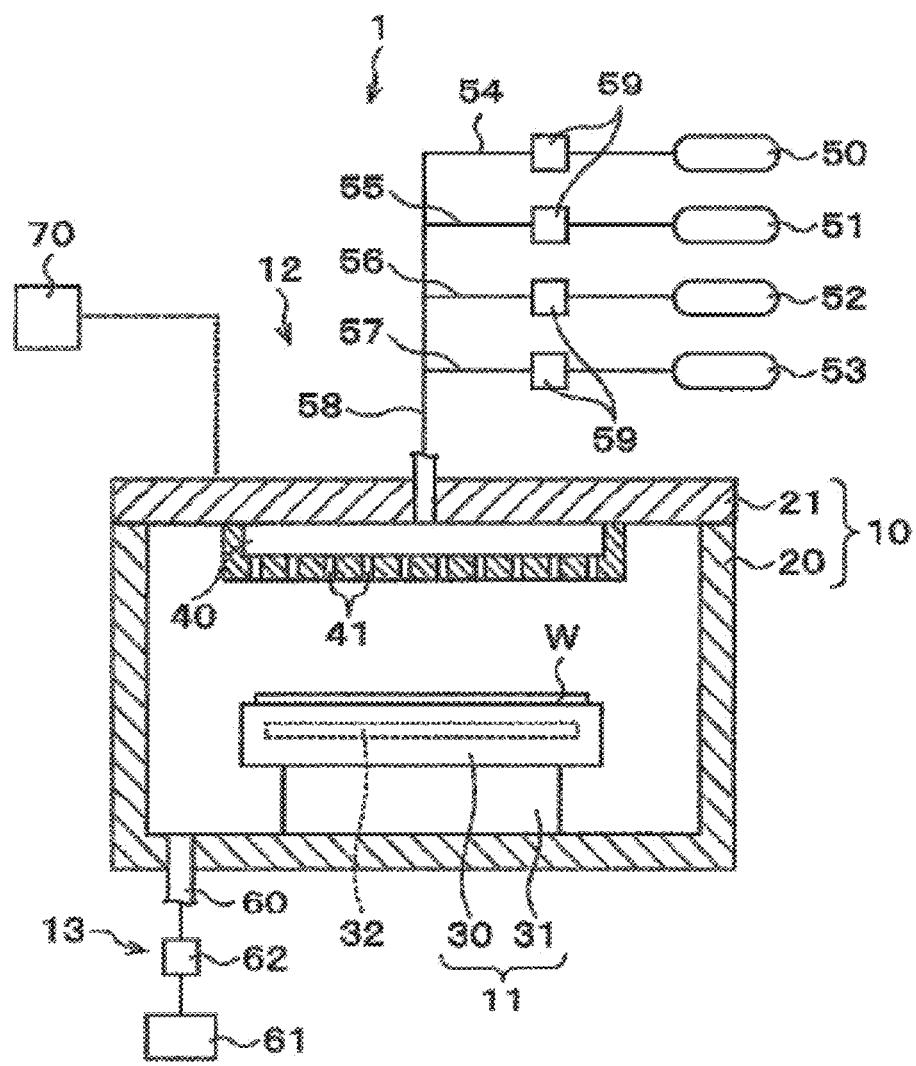
FIG. 2 is a longitudinal sectional view schematically showing the configuration of the etching apparatus according to the embodiment.

First, the configuration of an etching apparatus according to an embodiment of the present disclosure and a silicon-containing film to be etched by the etching apparatus will be described. FIG. 1 is a schematic view of a silicon-containing film to be etched by an etching apparatus 1 according to an embodiment. FIG. 2 is a longitudinal sectional view schematically showing the configuration of the etching apparatus 1 according to the embodiment.

In this embodiment, as shown in FIG. 1, a silicon-containing film S to be etched is formed on a wafer W as a substrate. The wafer W has a pattern P constituted by an oxide film or the like in which a hole Pa is formed. The silicon-containing film S formed inside the hole Pa and exposed from a front surface of the wafer W through the hole Pa is an etching target. In this embodiment, the silicon-containing film S as the etching target is a Si film (hereinafter sometimes referred to as a Si film S). The oxide film constituting the pattern P is, for example, an $SiO_2$ film.

As shown in FIG. 2, the etching apparatus 1 includes a chamber 10 in which the wafer W is accommodated, a mounting table 11 provided inside the chamber 10 to mount the wafer W thereon, an gas supply part 12 for supplying a process gas from above the mounting table 11 toward the mounting table 11, and an exhaust part 13 for discharging the process gas from the interior of the chamber 10. Etching performed in the etching apparatus 1 is a plasma-less gas etching.

The chamber 10 includes a chamber body 20 and a lid 21. An upper portion of the chamber body 20 is opened to define an opening. The opening is closed by the lid 21. An upper surface of the side wall of the chamber body 20 and a lower surface of the lid 21 are hermetically sealed by a seal material (not shown) to secure airtightness in the chamber 10. Thus, an airtight etching processing space is formed inside the chamber 10. A loading/unloading port (not shown) through which the wafer W is transferred is formed in the side wall of the chamber body 20. The loading/unloading port can be opened and closed by a gate valve (not shown).

The mounting table 11 includes an upper table 30 on which the wafer W is mounted, and a lower table 31 that is fixed to a bottom surface of the chamber body 20 and supports the upper table 30. A temperature adjusting part 32 for adjusting a temperature of the wafer W is provided inside the upper table 30. The temperature adjusting part 32 adjusts a temperature of the mounting table 11 by circulating a temperature adjustment medium such as water such that the temperature of the wafer W mounted on the mounting table 11 is controlled to a predetermined temperature.

The gas supply part 12 includes a shower head 40 for supplying the process gas onto the wafer W mounted on the mounting table 11. The shower head 40 is provided on a lower surface of the lid 21 of the chamber 10 so as to face the mounting table 11. A plurality of supply ports 41 through which the process gas is supplied is formed in a lower surface (shower plate) of the shower head 40. The shower head 40 may have a diameter larger than at least that of the wafer W in order to supply the process gas uniformly onto the entire surface of the wafer W mounted on the mounting table 11.

The gas supply part 12 further includes an $F_2$ gas supply source 50 for supplying an $F_2$ gas, an $NH_3$ gas supply source 51 for supplying an $NH_3$ gas, a $ClF_3$ gas supply source 52 for supplying a $ClF_3$ gas, and a $N_2$ gas supply source 53 for supplying an $N_2$ gas. An $F_2$ gas supply pipe 54 is connected to the $F_2$ gas supply source 50, an $NH_3$ gas supply pipe 55 is connected to the $NH_3$ gas supply source 51, a $ClF_3$ gas supply pipe 56 is connected to the $ClF_3$ gas supply source 52, and an $N_2$ gas supply pipe 57 is connected to the $N_2$ gas supply source 53. The supply pipes 54 to 57 are connected to a collective pipe 58 that is connected to the shower head 40. The $F_2$ gas, the $NH_3$ gas, the $ClF_3$ gas and the $N_2$ gas are supplied from the shower head 40 into the chamber 10 via the respective supply pipes 54 to 57 and the collective pipe 58.

Flow rate adjusters 59 configured to control opening/closing operations of the respective supply pipes 54 to 57 and flow rates of the respective process gases are respectively provided in the $F_2$ gas supply pipe 54, the $NH_3$ gas supply pipe 55, the $ClF_3$ gas supply pipe 56 and the $N_2$ gas supply pipe 57. Each of the flow rate adjusters 59 is constituted by, for example, an ON-OFF valve and a mass flow controller.

The process gas supplied from the gas supply part 12 includes two different fluorine-containing gases for etching the silicon-containing film. One of the two different fluorine-containing gases is defined as a first fluorine-containing gas including the $F_2$ gas and the $NH_3$ gas, and the other is defined as a second fluorine-containing gas including the $ClF_3$ gas. A gas mixed with the $F_2$ gas is not limited to the $NH_3$ gas but may be any basic gas. The $N_2$ gas is used as a dilution gas or a purge gas. Instead of the $N_2$ gas, other inert gas such as an Ar gas may be used, or two or more kinds of inert gases may be used.

In the gas supply part 12 of this embodiment, the process gas is supplied from the shower head 40 to the wafer W. However, the method of supplying the process gas is not limited thereto. For example, a gas supply nozzle (not shown) may be provided in the central portion of the lid 21 of the chamber 10, and the process gas may be supplied from the gas supply nozzle.

The exhaust part 13 includes an exhaust pipe 60 provided at the bottom of the chamber body 20 of the chamber 10 outward of the mounting table 11. An exhaust mechanism 61 configured to evacuate the interior of the chamber 10 is connected to the exhaust pipe 60. An automatic pressure control valve (APC) 62 is provided in the exhaust pipe 60. An internal pressure of the chamber 10 is controlled by the exhaust mechanism 61 and the automatic pressure control valve 62.

The etching apparatus 1 is provided with a control part 70. The control part 70 is, for example, a computer, and includes a program storage (not shown). A program for controlling the etching process performed in the etching apparatus 1 is stored in the program storage. The program may be recorded in a non-transitory computer-readable storage medium such as a computer-readable hard disk (HD), a flexible disk (FD), a magneto optical disk (MO), memory card or the like, and may be installed from the storage medium on the control part 70.

<Etching Method>

Next, an etching method in the etching apparatus 1 configured as above will be described. As described above, the etching apparatus 1 of this embodiment etches the Si film formed on the wafer W.

First, with the gate valve opened, the wafer W is loaded into the chamber 10 and mounted on the mounting table 11. The temperature of the mounting table 11 has been adjusted by the temperature adjusting part 32 so that the temperature of the wafer W mounted on the mounting table 11 is controlled to a predetermined temperature. In addition, once the wafer W is mounted on the mounting table 11, the gate valve is closed to make the interior of the chamber 10 airtight. Thus, an etching processing space is formed inside the chamber 10.

Thereafter, the interior of the chamber 10 is evacuated. While adjusting the internal pressure of the chamber 10, the $ClF_3$ gas as an etching gas is supplied into the chamber 10 to each Si film formed on the wafer W. At this time, in addition to the $ClF_3$ gas, a $N_2$ gas may be supplied as a dilution gas.

Subsequently, the $N_2$ gas as a purge gas is supplied into the chamber 10 to purge the interior of the chamber 10 while evacuating the interior of the chamber 10 again.

Thereafter, while adjusting the internal pressure of the chamber 10, the $F_2$ gas and the $NH_3$ gas are supplied as etching gases into the chamber 10 to further etch the Si film formed on the wafer W. At this time, the $N_2$ gas may be added as a dilution gas.

Subsequently, the $N_2$ gas as a purge gas is supplied into the chamber 10 to purge the interior of the chamber 10 while evacuating the interior of the chamber 10 again.

Thereafter, the above-described steps are repeated so that the $ClF_3$ gas-based etching and the $F_2$ gas/$NH_3$ gas-based etching are performed alternately a predetermined number of times.

While in the above embodiment, the $ClF_3$ gas-based etching is initially performed, the $F_2$ gas/$NH_3$ gas-based etching may be initially performed. In addition, while in the above example, the number of times of the $ClF_3$ gas-based etching and the number of times of the $F_2$ gas/$NH_3$ gas-based etching have been described to be equal to each other, they may be different from each other. In some embodiments, two types of etchings including the $ClF_3$ gas-based etching and the $F_2$ gas/$NH_3$ gas-based etching may be alternately performed a predetermined number of times and subsequently, the first etching of the two types of etchings may be again performed last.

<Effects of the Present Embodiment>

Next, the effects of the present embodiment will be described.

Verification was conducted under various etching conditions by the present inventors. As a result, the present inventors have found that, by using both the first fluorine-containing gas including the $F_2$ gas and the $NH_3$ gas and the second fluorine-containing gas including the $ClF_3$ gas as the etching gases in etching the Si film, the surface roughness of the silicon-containing film after etching can be reduced. The above findings will be described below.

In the related art, either one of the $F_2$ gas/the $NH_3$ gas and the $ClF_3$ gas was used as an etching gas for the Si film. In this regard, the present inventors conducted comparison/verification with respect to the surface roughness of an etched silicon-containing film in the case of using the set of $F_2$ gas and $NH_3$ gas, and the case of using the $ClF_3$ gas alone. As a result of the comparison, it was found that the state of the surface of the etched silicon-containing film showed the opposite tendency in the case of using both the set of $F_2$ gas and $NH_3$ gas and the case of using the $ClF_3$ gas alone.

Figure 3:
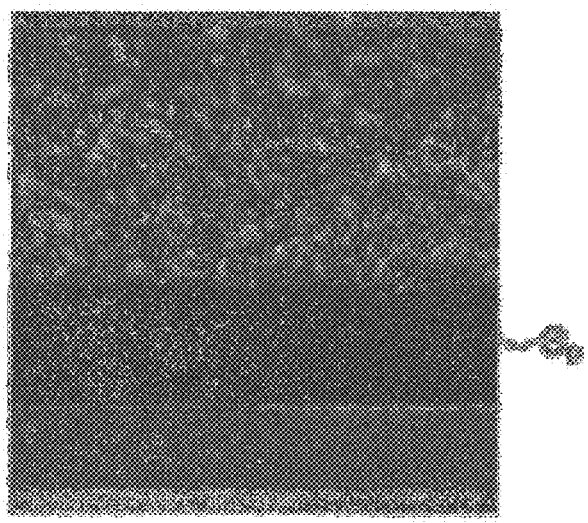
FIG. 3 is an SEM image showing a surface state of a polysilicon film when a polysilicon blanket is etched using a set of $F_2$ gas and $NH_3$ gas.
Figure 4:
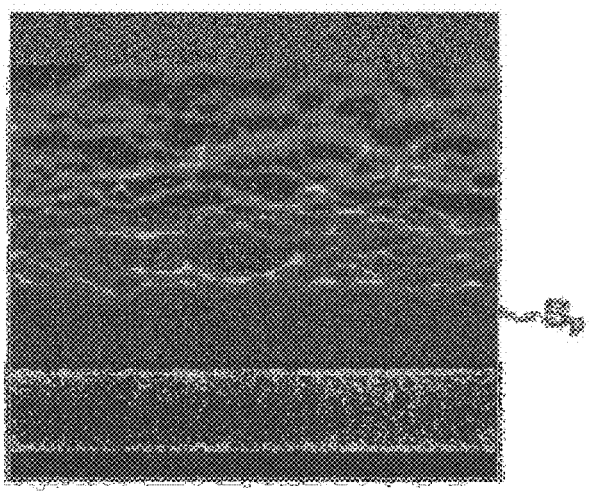
FIG. 4 is an SEM image showing a surface state of a polysilicon film when a polysilicon blanket is etched using a $ClF_3$ gas alone.

The results of the verification are shown in FIGS. 3 and 4. FIG. 3 is a scanning electron microscope (SEM) image showing the surface state of a polysilicon film when a polysilicon blanket is etched using the set of $F_2$ gas and $NH_3$ gas. FIG. 4 is an SEM image showing the surface state of a polysilicon film when a polysilicon blanket is etched using the $ClF_3$ gas alone. An arithmetic average roughness Sa of the polysilicon film before etching was 2.5 nm, and a root-mean-square roughness RMS was 3.1 nm.

As shown in FIG. 3, when the etching was performed using the set of $F_2$ gas and $NH_3$ gas, irregularities having a large aspect ratio and a narrow interval between adjacent irregularities were formed on a surface of a polysilicon film Sp after the etching. When polysilicon was etched using the set of $F_2$ gas and $NH_3$ gas, the arithmetic average roughness Sa was 6.7 nm and the root-mean-square roughness RMS was 8.3 nm.

On the other hand, as shown in FIG. 4, when the etching is performed using the $ClF_3$ gas alone, irregularities having a small aspect ratio and a wide interval between adjacent irregularities were formed on the surface of the polysilicon film Sp after the etching. When polysilicon was etched using the $ClF_3$ gas alone, the arithmetic average roughness Sa was 3.40 nm and the root-mean-square roughness RMS was 4.38 nm.

As described above, the state of the surface of the etched polysilicon film, namely the silicon-containing film, showed the opposite tendency in the case of using both the set of $F_2$ gas and $NH_3$ gas and the case of using the $ClF_3$ gas alone.

The results shown in FIGS. 3 and 4 were obtained for the case where the silicon-containing film to be etched is a polysilicon blanket. Similar results were obtained for the case where the Si film S formed in the hole Pa of the pattern on the wafer W as shown in FIG. 1 was etched.

Figure 5:
FIG. 5 is an SEM image showing a surface state of a polysilicon film when a polysilicon blanket is etched using both the set of $F_2$ gas and $NH_3$ gas and the $ClF_3$ gas.

Based on these results, the present inventors conducted etching using both the set of $F_2$ gas and $NH_3$ gas and the $ClF_3$ gas. FIG. 5 is an SEM image showing the surface state of polysilicon when a polysilicon blanket is etched using both the set of $F_2$ gas and $NH_3$ gas and the $ClF_3$ gas. The verification result of FIG. 5 was obtained by alternately performing the etching based on the $ClF_3$ gas and the etching based on the set of $F_2$ and $NH_3$ gas twice, and subsequently, performing the etching based on the $ClF_3$ gas again.

As shown in FIG. 5, the surface roughness of the etched polysilicon film, which is available when using both the set of $F_2$ gas and $NH_3$ gas and the $ClF_3$ gas, can be smaller than that available when using any one of the set of $F_2$ gas and NH₃ gas and the ClF₃ gas. When etching polysilicon with both the set of F₂ gas and NH₃ gas and the ClF₃ gas, the arithmetic average roughness Sa was 2.0 nm and the root-mean-square roughness RMS was 2.5 nm. Similar results were obtained for the case where the silicon-containing film to be etched was the Si film S formed in the hole Pa of the pattern on the wafer W as shown in FIG. 1.

As described above, according to the verification results shown in FIGS. 3 to 5, by using both the set of F₂ gas and NH₃ gas and the ClF₃ gas, it is possible to reduce the surface roughness of the etched Si film.

<Mechanism of Surface Roughness Improvement>

Figure 6A:
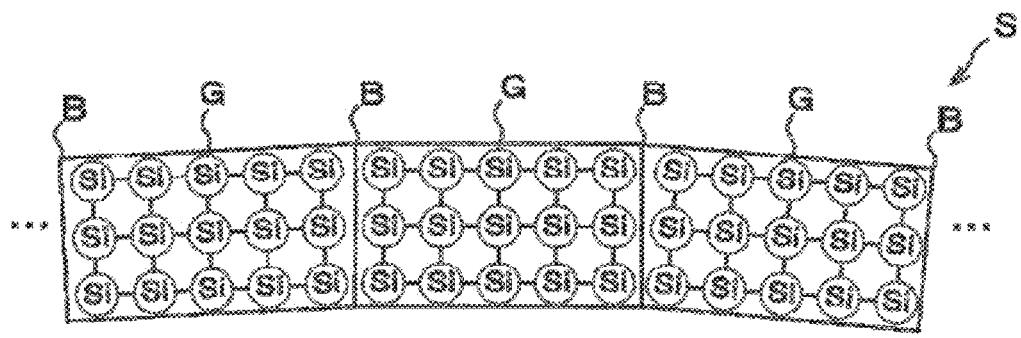
FIGS. 6A and 6B are explanatory views showing an etching state available when the set of $F_2$ gas and $NH_3$ gas are used as etching gases.
Figure 6B:
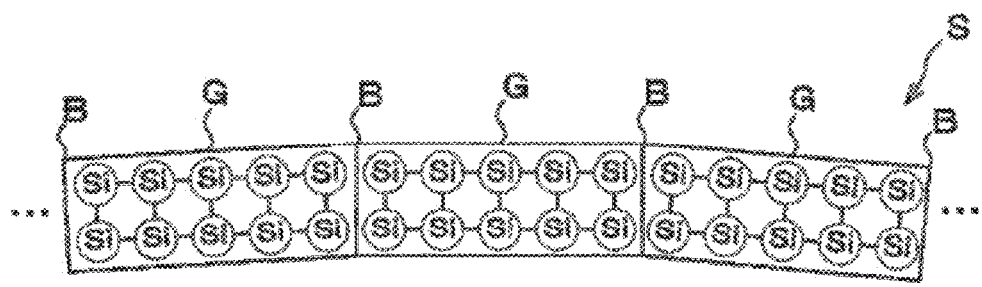
Figure 7A:
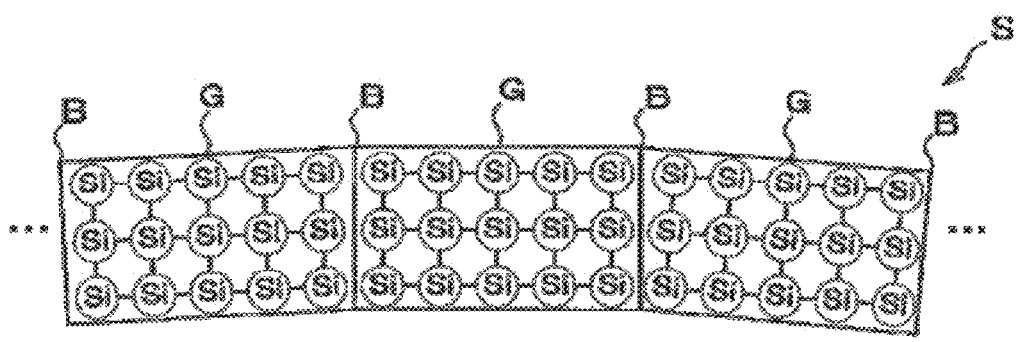
FIGS. 7A and 7B are explanatory views showing an etching state when only the $ClF_3$ gas is used as an etching gas.
Figure 7B:
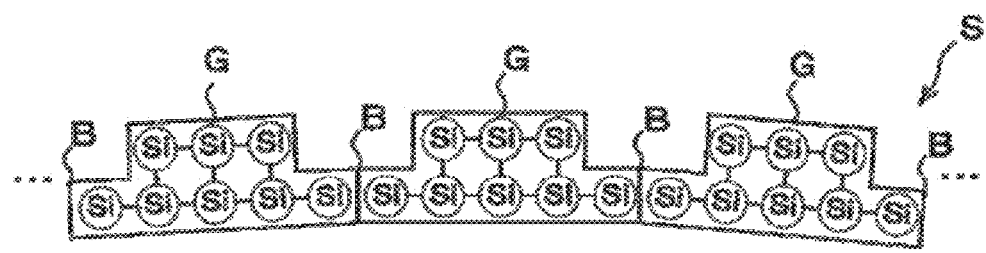

Next, the mechanism by which the surface roughness of the etched Si film can be reduced by using both the set of F₂ gas and NH₃ gas and the ClF₃ gas as described above will be described. FIGS. 6A and 6B are explanatory views showing the state of a Si film when being etched with the set of F₂ gas and NH₃ gas. FIGS. 7A and 7B are explanatory views showing the state of a Si film when being etched with the ClF₃ gas alone. FIGS. 6A and 7A show the state of the Si film before the etching, and FIGS. 6B and 7B show the state of the Si film after the etching.

It is assumed that the silicon-containing film to be etched is a polysilicon film. The Si film S as a polysilicon film has grains G having different crystal orientations, and a crystal grain boundary B exists between the grains G.

Etching progresses through diffusion/supply and adsorption of reactive species onto the surface, formation of reaction products, and desorption/diffusion of the reaction products from the surface. The F₂ gas has weak reactivity. Thus, it is considered that the etching progresses for not only the grain boundaries B but also the entire grains G, thereby forming irregularities having relatively narrow intervals.

On the other hand, the ClF₃ gas has a much stronger reactivity than that of the F₂ gas. Thus, in the case of using the ClF₃ gas alone, the etching progresses for the entire Si film S, and particularly tends to concentratively progress for the crystal grain boundaries B having weak coupling. As a result, it is considered that irregularities having wide intervals are formed. Thus, the progression of the etching based on the ClF₃ gas alone may further facilitate the formation of the irregularities.

Utilizing these features, it is conceived that, by combining a method of finely etching the Si film to be etched and a method of widely etching the Si film to be etched at a high speed with both the F₂ gas and the ClF₃ gas, it is possible to make the surface of the etched Si film flat.

In a case where the silicon-containing film to be etched is an amorphous silicon film, the amorphous silicon film has a lump-like structure like the polysilicon film and thin grains present between the lumps. Thus, it is thought that the etching progresses for the amorphous silicon film with both the F₂ gas and the ClF₃ gas, like the polysilicon film.

<Other Effects of the Present Embodiment>

Next, other effects of the present embodiment will be described.

Verification was conducted under various etching conditions by the present inventors. As a result, the present inventors have found that, by etching a Si film on a substrate having a pattern in which a hole is formed so as to expose an etching target portion, using both the first fluorine-containing gas including the F₂ gas and the NH₃ gas and the second fluorine-containing gas including the ClF₃ gas as the etching gases, the surface of the etched Si film in the hole can be flattened. Such findings will be described below.

As described above, in the related art, one of the set of F₂ gas and NH₃ gas and the ClF₃ gas was used as an etching gas for the Si film. In this regard, the present inventors conducted comparison/verification with respect to the flatness of the surface of the etched Si film in the hole of the pattern in the case of using the set of F₂ gas and NH₃ gas and the case of using the ClF₃ gas alone. As a result of the comparison, it was found that the shape of the surface of the etched Si film showed the opposite tendency in the case of using the set of F₂ gas and NH₃ gas and the case of using the ClF₃ gas alone.

Figure 8:
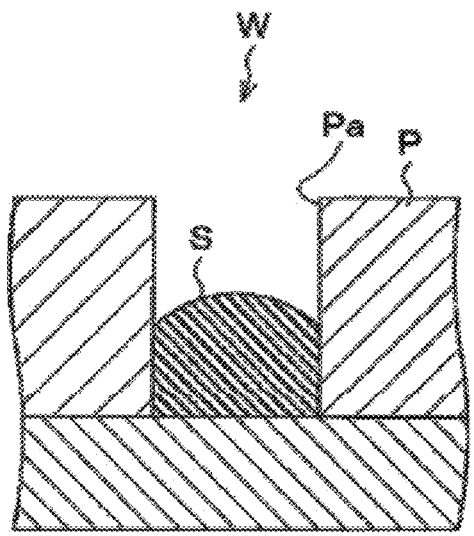
FIG. 8 is a schematic sectional view showing the shape of the surface of a Si film when a patterned Si film is etched using the set of $F_2$ gas and $NH_3$ gas.
Figure 9:
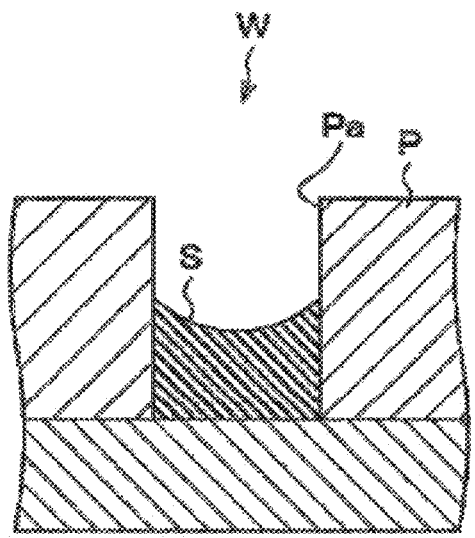
FIG. 9 is a schematic sectional view showing the shape of the surface of a Si film when a patterned Si film is etched using the $ClF_3$ gas alone.

The results of the verification are shown in FIGS. 8 and 9. FIG. 8 is a schematic sectional view showing the shape of the surface of a Si film when a patterned Si film is etched with the set of F₂ gas and NH₃ gas. FIG. 9 is a schematic sectional view showing the shape of the surface of the Si film when the patterned Si film is etched with the ClF₃ gas alone.

As shown in FIG. 8, when the etching was performed using the F₂ gas and the NH₃ gas, the surface of the etched Si film S in the hole Pa of the pattern P had an upwardly-protruded convex shape. On the other hand, as shown in FIG. 9, when the etching was performed using the ClF₃ gas, the surface of the etched Si film in the hole Pa of the pattern P had a downwardly-recessed concave shape.

As described above, the shape of the surface of the etched Si film in the hole Pa of the pattern P showed the opposite tendency in the case of using the set of F₂ gas and NH₃ gas and the case of using the ClF₃ gas alone. In other words, in the case of using the set of F₂ gas and NH₃ gas and the case of using the ClF₃ gas alone, different etching rates are manifested at the central portion and the peripheral portion of the hole Pa.

Figure 10:
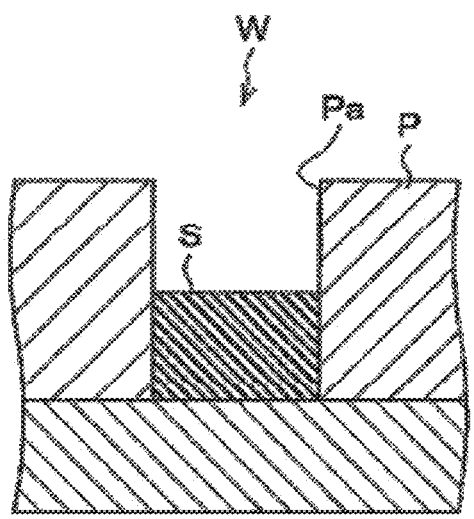
FIG. 10 is a schematic sectional view showing the shape of the surface of a Si film when a patterned Si film is etched using both the set of $F_2$ gas and $NH_3$ gas and the $ClF_3$ gas.

Based on these results, the present inventors conducted etching with the set of F₂ gas and NH₃ gas and the ClF₃ gas. FIG. 10 is a schematic sectional view showing the shape of the surface of the Si film when the patterned Si film is etched using the set of F₂ gas and NH₃ gas and the ClF₃ gas. The verification results of FIG. 10 were obtained by initially performing the supply of the set of F₂ gas and NH₃ gas and subsequently, alternately performing the supply of the set of F₂ gas and NH₃ gas and the supply of the ClF₃ gas alone twice.

As shown in FIG. 10, by using both the set of F₂ gas and NH₃ gas and the ClF₃ gas, the surface of the etched Si film S in the hole Pa of the pattern P becomes flat.

As described above, according to the verification results shown in FIGS. 8 to 10, by using both the set of F₂ gas and NH₃ gas and the ClF₃ gas, it is possible to planarize the surface of the etched Si film in the hole of the pattern formed on the wafer W.

<Planarization Mechanism>

Next, the mechanism by which the surface of the etched Si film in the hole of the pattern can be planarized using both the set of F₂ gas and NH₃ gas and the ClF₃ gas as described above will be described. FIGS. 11A to 11E are explanatory views showing the state of the surface of the Si film in the hole of the pattern when the etching is performed using the ClF₃ gas and the F₂ gas and the NH₃ gas.

Prior to describing the planarization mechanism, a mechanism in which the surface of the Si film in the hole becomes concave when using the ClF₃ gas alone and a mechanism in which the surface of the Si film in the hole becomes convex when using the set of F₂ gas and NH₃ gas, will be described.

The ClF₃ gas and the set of the F₂ gas and the NH₃ gas differ from each other not only in their molecular weights but also in the surface adsorption onto the Si film and the characteristics of reaction with the Si film. In addition, as the etching of the Si film S progresses, the density of etching gas molecules reaching the surface of the Si film S becomes higher in the central portion rather than in the peripheral portion in the hole Pa of the pattern P. In the case of using the $ClF_3$ gas alone, due to the adsorption of the $ClF_3$ gas onto the surface of the Si film or the reactivity of the $ClF_3$ gas, it is difficult for the $ClF_3$ gas to be diffused in a direction parallel to the surface of the wafer W along the surface or the like of the Si film S in the hole Pa of the pattern P. Therefore, in the case of using the $ClF_3$ gas alone as the etching gas for the Si film S, it is thought that the surface of the etched Si film in the hole Pa of the pattern P has a downwardly-recessed concave shape as shown in FIG. 9.

On the other hand, in the case of using only the $F_2$ gas and the $NH_3$ gas, the $F_2$ gas and the $NH_3$ gas is likely to be diffused in the hole Pa of the pattern P due to the adsorption of the $F_2$ gas and the $NH_3$ gas on the surface of the Si film S or the reactivity thereof. Therefore, the etching of the Si film S is hardly performed at the central portion of the hole Pa as compared with the case of using the $ClF_3$ gas alone. In addition, the etching is performed over a plurality of divided cycles. Many reaction products generated in a preceding cycle due to the presence of the $NH_3$ gas remain in the peripheral portion in the hole Pa during exhaust between the cycles. The etching using only the $F_2$ gas and the $NH_3$ gas is promoted by such reaction products. As a result, the etching progresses more in the peripheral portion than in the central portion in the hole Pa. Therefore, in the case of etching the Si film S with only the set of $F_2$ gas and $NH_3$ gas as the etching gas, it is thought that the surface of the etched Si film in the hole Pa of the pattern P has an upwardly-protruded convex shape as shown in FIG. 8.

Figure 11A:
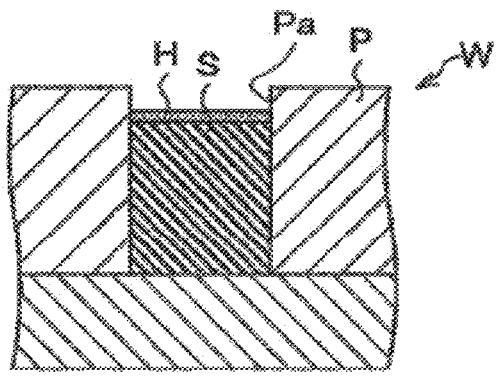
FIGS. 11A to 11E are explanatory views showing an etching state of a Si film in a hole of a pattern when the $ClF_3$ gas and the set of $F_2$ gas and $NH_3$ gas are used as etching gases.
Figure 11B:
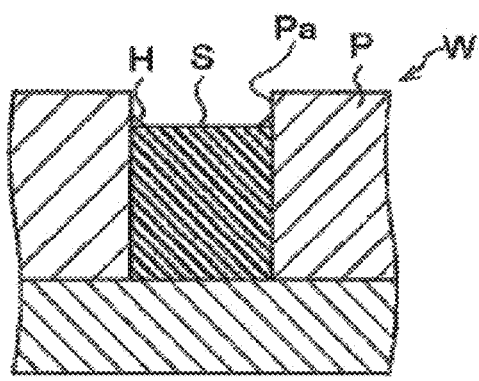
Figure 11C:
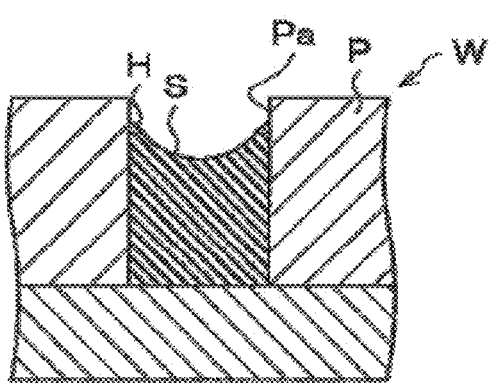
Figure 11D:
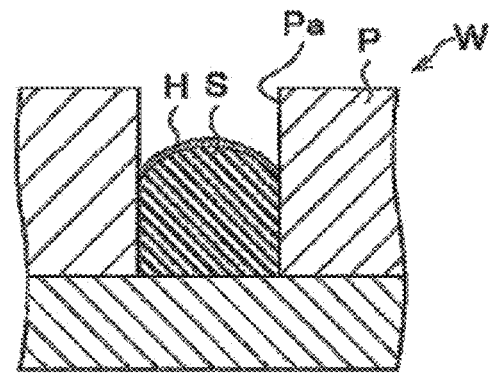
Figure 11E:
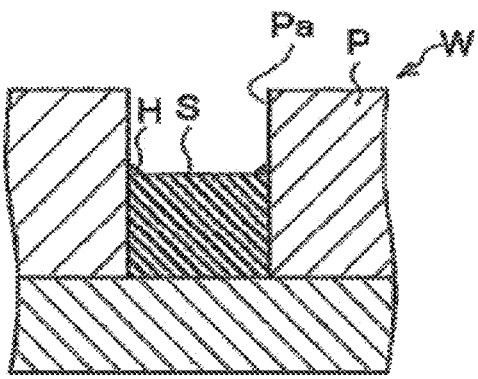

It is assumed that both the $ClF_3$ gas and the set of $F_2$ gas and $NH_3$ gas are used. For example, when the set of $F_2$ gas and $NH_3$ gas is initially used, as shown in FIG. 11A, the above-mentioned reaction products H present evenly in the hole Pa. Thus, the surface of the etched Si film S in the hole Pa is substantially flat. However, the etching amount is insufficient at this stage. Thereafter, when exhaust is performed, as shown in FIG. 11B, the reaction products H present while being biased to the peripheral portion in the hole Pa. Subsequently, when the etching is performed with the $ClF_3$ gas, as described above, due to the adsorption of the $ClF_3$ gas onto the surface or the reactivity of the $ClF_3$ gas, the surface of the etched Si film in the hole Pa of the pattern P has a concave shape as shown in FIG. 11C. Thereafter, exhaust is performed and the set of $F_2$ gas and $NH_3$ gas is used. The etching of the Si film in the hole Pa is promoted in the peripheral portion rather than in the central portion by the reaction products H. As a result, the surface of the etched Si film in the hole Pa has a convex shape as shown in FIG. 11D. Thereafter, exhaust is performed and the $ClF_3$ gas is used. Thus, the hole Pa is likely to be etched in the central portion whose film thickness is relatively thick. As a result, the surface of the etched Si film in the hole Pa has a flat shape as shown in FIG. 11E. Accordingly, the planarization mechanism is effective.

<Other Embodiments>

While in the above embodiments, the Si film etching method has been described, the method of the present disclosure may also be applied to other silicon-containing films.

For example, when etching a silicon germanium (SiGe) film, both a first fluorine-containing gas exclusive of the $NH_3$ gas but inclusive of the $F_2$ gas and a second fluorine-containing gas inclusive of the $ClF_3$ gas are used as etching gases.

In the above example, the second fluorine-containing gas different from the first fluorine-containing gas inclusive of the $F_2$ gas includes the $ClF_3$ gas, but not limited thereto. The second fluorine-containing gas may include at least a $ClF_3$ gas, an $IF_7$ gas, an IF gas or an $SF_6$ gas.

In the above embodiments, the first fluorine-containing gas inclusive of the $F_2$ gas and the second fluorine-containing gas inclusive of the $ClF_3$ gas has been described to be alternately supplied, but not limited thereto. The first fluorine-containing gas and the second fluorine-containing gas may be mixed and supplied simultaneously as etching gases.

In some embodiments, assuming that one step including the etching using the first fluorine-containing gas, the exhaust of the first fluorine-containing gas, the etching using the second fluorine-containing gas, and the exhaust of the second fluorine-containing gas is repeated, the amount of etching in each step may be gradually reduced. This makes it possible to further reduce the surface roughness of the etched silicon-containing film.

According to the present disclosure in some embodiments, when etching a silicon-containing film formed on a substrate, it is possible to reduce a surface roughness of the etched silicon-containing film. Further, when etching a silicon-containing film formed on a substrate having a pattern in which a hole is formed so as to expose an etching target portion, it is possible to planarize the surface of the etched silicon-containing film in the hole.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of etching a silicon-containing film formed on a substrate, the method comprising:
    etching, without using a plasma, the silicon-containing film in an etching apparatus by supplying a first fluorine-containing gas and a second fluorine-containing gas by turns, the first fluorine-containing gas including at least an $F_2$ gas and the second fluorine-containing gas including at least a $ClF_3$ gas, an $IF_7$ gas, an $IF_5$ gas or an $SF_6$ gas,
    wherein the first fluorine-containing gas is different from the second fluorine-containing gas, and
    the first fluorine-containing gas and the second fluorine-containing gas are differ in reactivity with the silicon-containing film.

2. The method of claim 1, wherein the supplying the first fluorine-containing gas and the second fluorine-containing gas by turns is performed in a repetitive manner.

3. A non-transitory computer-readable storage medium storing a program that operates on a computer of a controller for controlling an etching apparatus and that causes the computer to perform the etching method of claim 1 by the etching apparatus.

4. The method of claim 1, the first fluorine-containing gas further includes a $NH_3$ gas.

5. The method of claim 2, wherein an amount of etching is gradually reduced in each repetitive process of the supplying the first fluorine-containing gas and the second fluorine-containing gas by turns.

* * * * *